United States Patent
Carpenter et al.

(10) Patent No.: US 6,800,172 B2
(45) Date of Patent: Oct. 5, 2004

(54) INTERFACIAL STRUCTURE FOR SEMICONDUCTOR SUBSTRATE PROCESSING CHAMBERS AND SUBSTRATE TRANSFER CHAMBERS AND FOR SEMICONDUCTOR SUBSTRATE PROCESSING CHAMBERS AND ACCESSORY ATTACHMENTS, AND SEMICONDUCTOR SUBSTRATE PROCESSOR

(75) Inventors: Craig M. Carpenter, Boise, ID (US); Ross S. Dando, Nampa, ID (US); Allen P. Mardian, Boise, ID (US); Kevin T. Hamer, Meridian, ID (US); Raynald B. Cantin, Boise, ID (US); Philip H. Campbell, Meridian, ID (US); Kimberly R. Tschepen, Corvallis, OR (US); Randy W. Mercil, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 10/082,599

(22) Filed: Feb. 22, 2002

(65) Prior Publication Data

US 2003/0159780 A1 Aug. 28, 2003

(51) Int. Cl.[7] .................. C23F 1/00; H01L 21/306; C23C 16/00
(52) U.S. Cl. .............. 156/345.31; 156/345.32; 118/719; 414/939; 204/298.25; 204/298.35
(58) Field of Search ............... 118/719; 156/345.31, 156/345.32; 414/719

(56) References Cited

U.S. PATENT DOCUMENTS

| | | | | |
|---|---|---|---|---|
| 3,618,919 A | * | 11/1971 | Beck | 432/237 |
| 4,289,061 A | * | 9/1981 | Emmett | 411/34 |
| 4,438,724 A | * | 3/1984 | Doehler et al. | 118/719 |
| 4,545,136 A | * | 10/1985 | Izu et al. | 34/636 |
| 4,948,979 A | | 8/1990 | Munakata et al. | |

(List continued on next page.)

FOREIGN PATENT DOCUMENTS

| | | | | |
|---|---|---|---|---|
| JP | 63256460 A | * | 10/1988 | ............. B41J/3/20 |
| JP | 401273991 A | | 11/1989 | |
| JP | 406151558 A | | 5/1994 | |
| JP | 6342785 | | 12/1994 | |
| JP | 08034678 A | * | 2/1996 | ........... C04B/38/00 |
| JP | 2001082682 A | * | 3/2001 | ........... F16L/59/02 |
| JP | 2001261375 A | * | 9/2001 | ........... C03C/17/22 |

OTHER PUBLICATIONS

U.S. patent application Ser. No. 10/132,003, Dando et al., filed Apr. 24, 2002.
U.S. patent application Ser. No. 10/132,767, Dando et al., filed Apr. 24, 2002.
U.S. patent application Ser. No. 10/365,085, Carpenter et al., filed Feb. 11, 2003.

Primary Examiner—Parviz Hassanzadeh
Assistant Examiner—Karla Moore
(74) Attorney, Agent, or Firm—Wells St. John P.S.

(57) ABSTRACT

A semiconductor substrate processor includes a substrate transfer chamber and a plurality of substrate processing chambers connected therewith. An interfacial structure is received between at least one of the processing chambers and the transfer chamber. The interfacial structure includes a substantially non-metallic, thermally insulative mass of material interposed between the one processing chamber and the transfer chamber. The mass is of sufficient volume to effectively reduce heat transfer from the processing chamber to the transfer chamber than would otherwise occur in the absence of said mass of material. An interfacial structure includes a body having a substrate passageway extending therethrough. The passageway includes walls at least a portion of which are substantially metallic. The body includes material peripheral of the walls which is substantially non-metallic and thermally insulative. The substantially non-metallic material has mounting openings extending at least partially therein.

68 Claims, 7 Drawing Sheets

U.S. PATENT DOCUMENTS

| | | | |
|---|---|---|---|
| 4,949,669 A | | 8/1990 | Ishii et al. |
| 5,076,205 A | | 12/1991 | Vowles et al. |
| 5,172,849 A | * | 12/1992 | Barten et al. ................. 228/18 |
| 5,223,113 A | * | 6/1993 | Kaneko et al. ......... 204/298.33 |
| 5,364,219 A | | 11/1994 | Takahashi et al. |
| 5,445,491 A | | 8/1995 | Nakagawa et al. |
| 5,562,800 A | * | 10/1996 | Kawamura et al. ......... 414/806 |
| 5,592,581 A | | 1/1997 | Okase |
| 5,626,936 A | * | 5/1997 | Alderman ..................... 428/68 |
| 5,640,751 A | * | 6/1997 | Faria ....................... 29/525.02 |
| 5,693,288 A | * | 12/1997 | Nakamura .................. 266/103 |
| 5,746,434 A | * | 5/1998 | Boyd et al. ................. 277/312 |
| 5,769,952 A | * | 6/1998 | Komino ...................... 118/733 |
| 5,820,461 A | | 10/1998 | Pernatozzi |
| 5,827,370 A | | 10/1998 | Gu |
| 5,997,588 A | * | 12/1999 | Goodwin et al. .......... 29/25.01 |
| 6,045,620 A | * | 4/2000 | Tepman et al. ............. 118/733 |
| 6,089,543 A | * | 7/2000 | Freerks ....................... 251/357 |
| 6,174,366 B1 | | 1/2001 | Ihantola |
| 6,178,660 B1 | | 1/2001 | Emmi et al. |
| 6,192,827 B1 | | 2/2001 | Welch et al. |
| 6,193,802 B1 | | 2/2001 | Pang et al. |
| 6,194,628 B1 | | 2/2001 | Pang et al. |
| 6,197,119 B1 | | 3/2001 | Dozoretz et al. |
| 6,200,415 B1 | * | 3/2001 | Maraschin ............. 156/345.52 |
| 6,255,222 B1 | | 7/2001 | Xia et al. |
| 6,263,829 B1 | * | 7/2001 | Schneider et al. ........ 118/723 I |
| 6,280,584 B1 | * | 8/2001 | Kumar et al. .......... 204/298.15 |
| 6,309,161 B1 | | 10/2001 | Hofmeister |
| 6,347,918 B1 | * | 2/2002 | Blahnik ...................... 414/217 |
| 6,506,254 B1 | * | 1/2003 | Bosch et al. ................ 118/715 |
| 6,541,353 B1 | | 4/2003 | Sandhu et al. |
| 6,562,141 B2 | | 5/2003 | Clarke |
| 6,602,346 B1 | | 8/2003 | Gochberg et al. |
| 6,638,672 B2 | | 10/2003 | Deguchi |
| 6,673,196 B1 | * | 1/2004 | Oyabu ..................... 156/345.1 |
| 2002/0185067 A1 | | 12/2002 | Upham |
| 2002/0195201 A1 | * | 12/2002 | Beer et al. ............. 156/345.31 |

\* cited by examiner

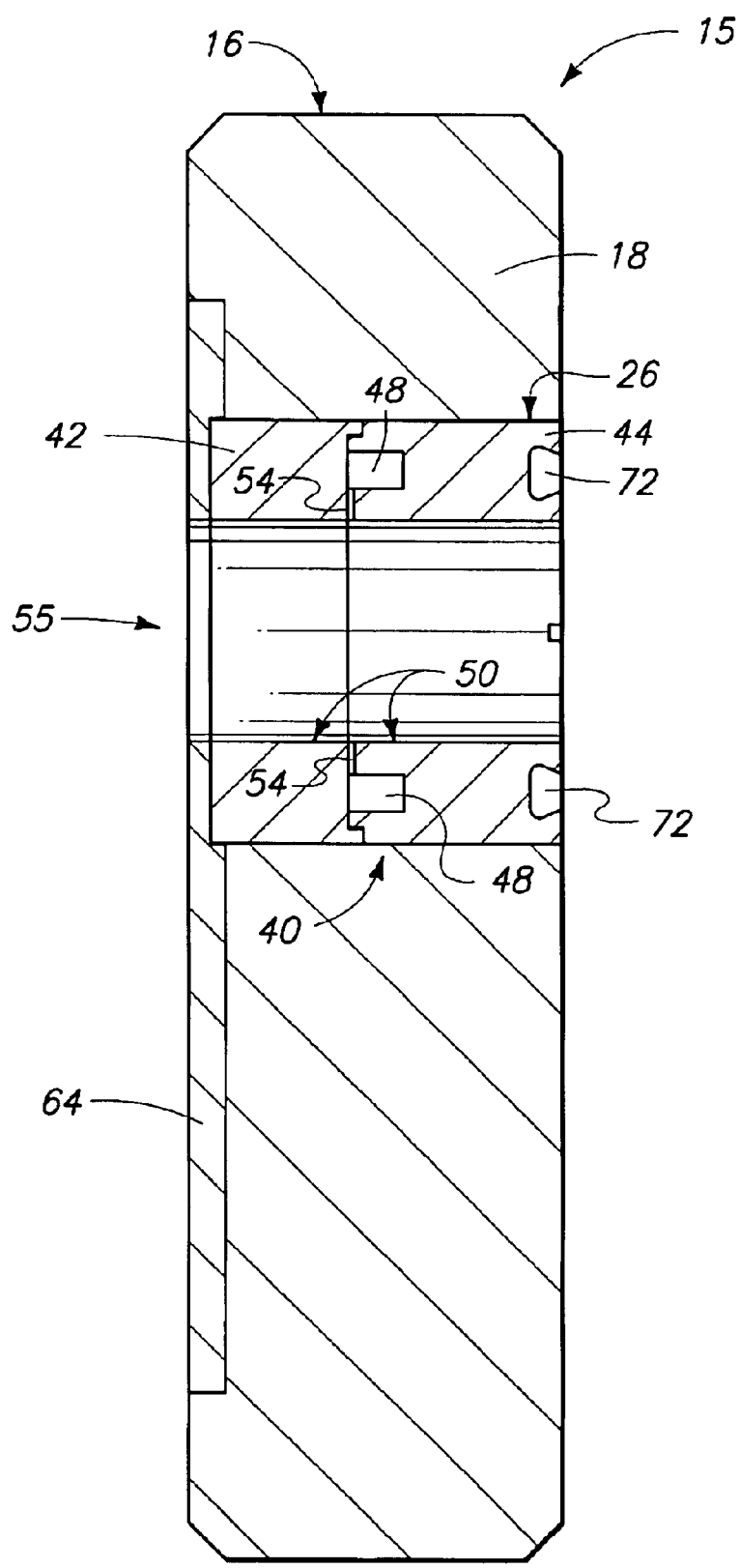

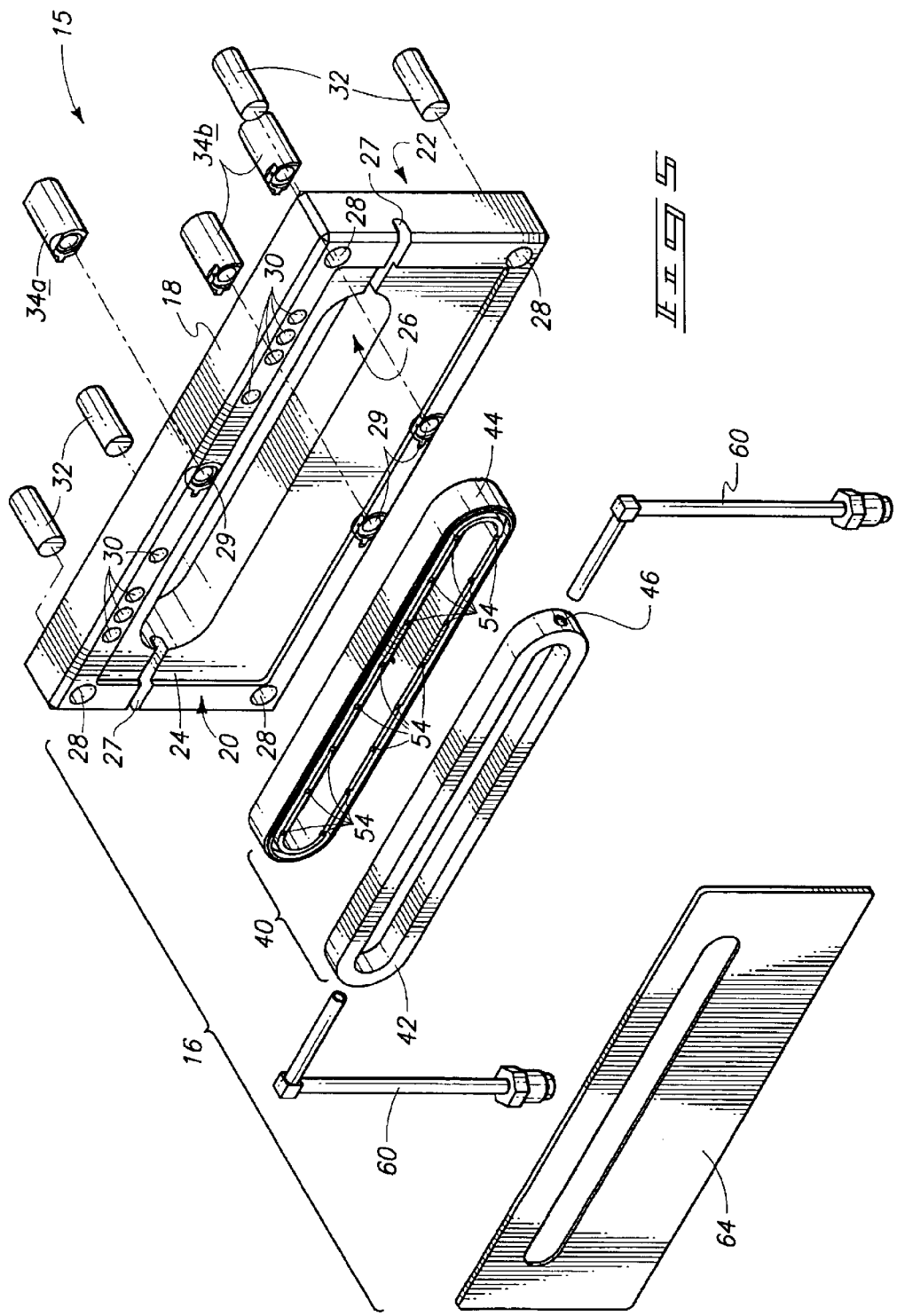

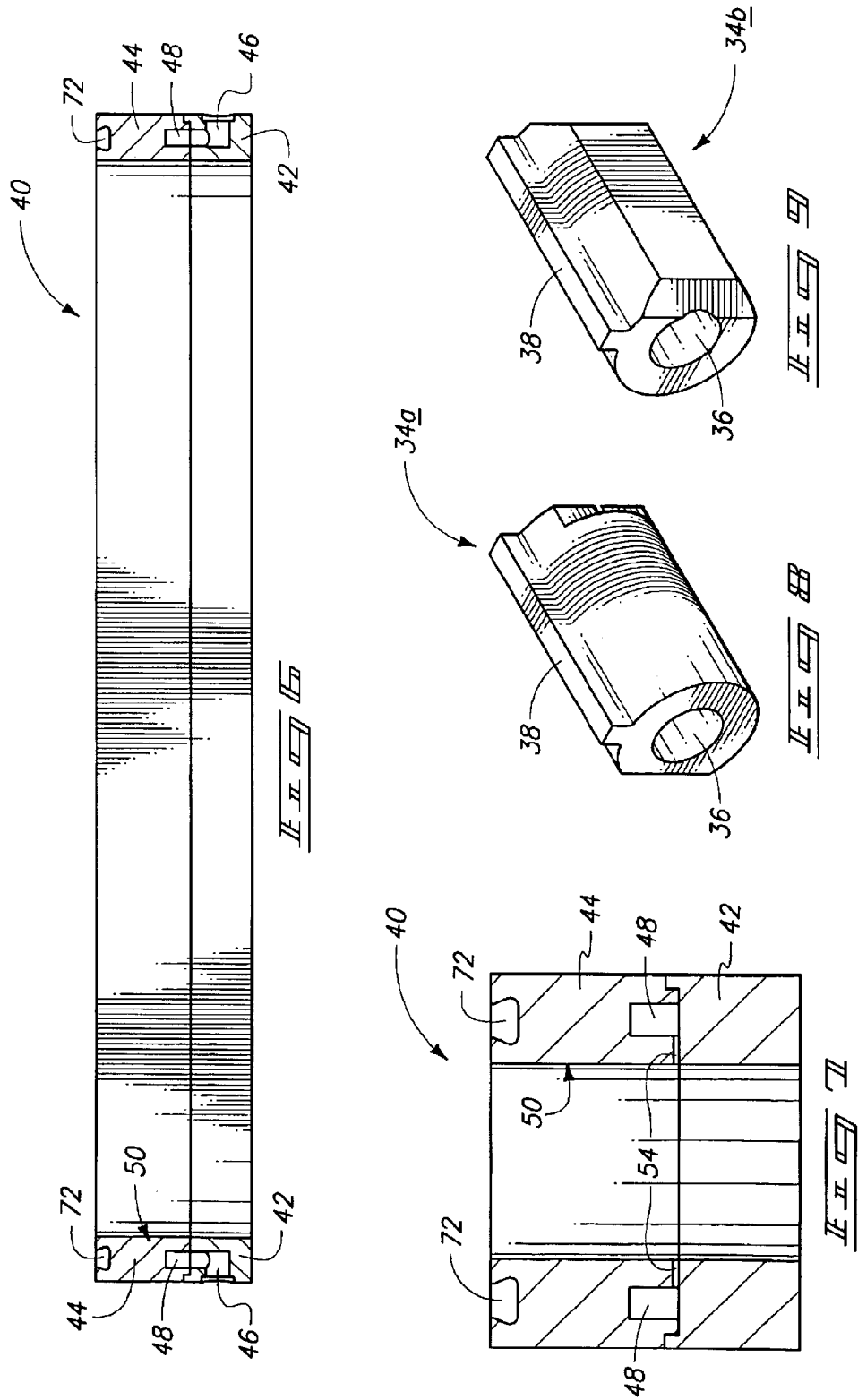

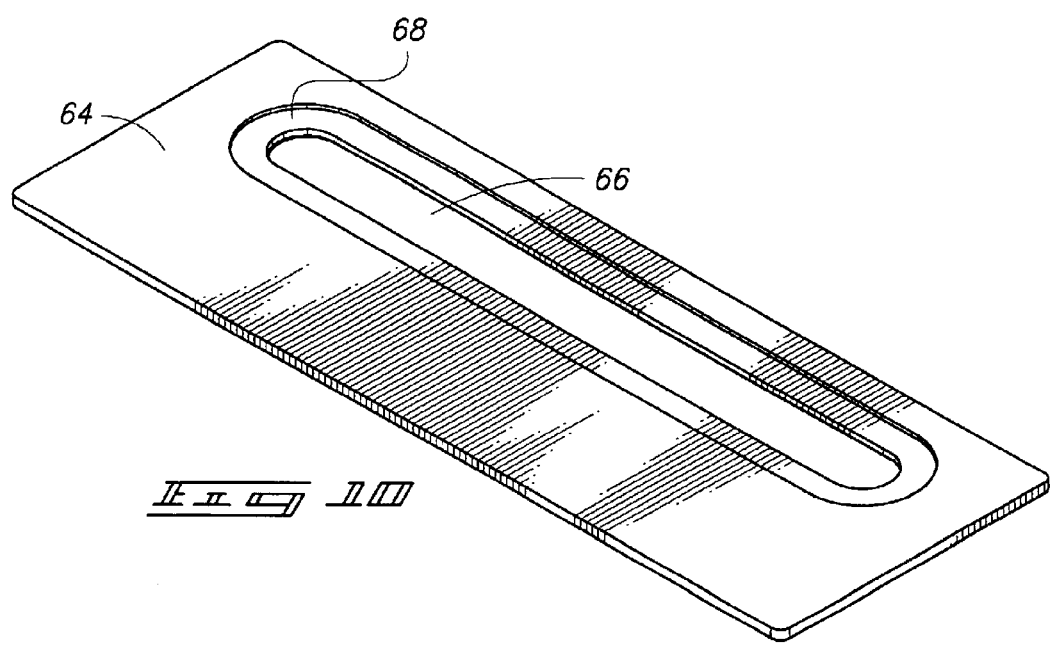

INTERFACIAL STRUCTURE FOR SEMICONDUCTOR SUBSTRATE PROCESSING CHAMBERS AND SUBSTRATE TRANSFER CHAMBERS AND FOR SEMICONDUCTOR SUBSTRATE PROCESSING CHAMBERS AND ACCESSORY ATTACHMENTS, AND SEMICONDUCTOR SUBSTRATE PROCESSOR

TECHNICAL FIELD

This invention relates to interfacial structures for receipt between semiconductor substrate processing chambers and substrate transfer chambers and between semiconductor substrate processing chambers and accessory attachments, and to semiconductor substrate processors.

BACKGROUND OF THE INVENTION

Integrated circuitry fabrication typically involves using processing equipment having chambers which are sealed from the environment for control of the atmosphere within which substrates are processed. Some wafer processors, particularly deposition processors, utilize a substrate transfer chamber which is connected with a plurality of separate substrate processing chambers. Substrates are subjected to separate processings within individual chambers, with the substrates being moved to and from the individual processing chambers and the transfer chamber by robotic arms.

By way of example only, one existing semiconductor substrate family of processors includes the Applied Materials Centura Chemical Vapor Deposition Processors. Such processors employ a central substrate transfer chamber having a plurality of processing chambers peripherally mounted thereto. The processing chambers individually mount to the transfer chamber by metallic interface blocks or structures. Such structures include an elongated slot or passageway through which individual semiconductor substrates can be moved into and out of the respective processing chambers relative to the transfer chamber. The processings within the various chambers are typically conducted at subatmospheric pressure. The transfer chamber is typically maintained at a slightly higher subatmospheric pressure than that of the process chambers to restrict material injected into the processing chambers from entering the transfer chamber.

Further, an additional method of facilitating such is to form a gas curtain across the elongated slot/passageway within the interface block. Such is provided in the Centura processors by utilizing a single gas emission opening at one side of the passageway and which is fed by a single inert gas feeding conduit. During processing, an inert gas is emitted from the single conduit intending to flow completely across the passageway and thereby provide an effective curtain/shield to any substantial flow of processing gasses within the chamber through the passageway into the transfer chamber. Further, with the processing chamber being at a lower pressure than the transfer chamber, a substantial majority of the inert curtain gas is typically drawn into the processing chamber. Such is emitted therefrom through a vacuum line and pump associated with the respective processing chamber.

Individual processing chambers have typically, in the past, been provided at or subjected to temperatures which usually do not exceed 80° C. The transfer chamber is typically not provided with a separate heat source intended to maintain the temperature thereof or therein at some controlled temperature. Yet, some existing and future generation processes (for example chemical vapor deposition including atomic layer deposition) are resulting in elevated processor chamber body temperatures well in excess of 80° C. This can result in adduct and other process residue accumulations within the processing chambers. Further, and particularly with higher chamber body temperatures, cold spots may develop within the processing chamber, and particularly proximate the transfer chamber.

The invention was motivated in addressing issues such as those identified above, but is in no way so limited. The invention is only limited by the accompanying claims as literally worded without limiting or interpretative reference to the specification or drawings, and in accordance with the doctrine of equivalents.

SUMMARY

The invention includes interfacial structures for semiconductor substrate processing chambers and substrate transfer chambers, and semiconductor substrate processors. In but one implementation, a semiconductor substrate processing chamber and substrate transfer chamber interfacial structure includes a body sized and shaped to engage with and between a semiconductor substrate processing chamber and a substrate transfer chamber. The body includes a substrate passageway extending therethrough. The passageway includes walls at least a portion of which are substantially metallic. The body includes material peripheral of the walls which is substantially non-metallic and thermally insulative. The substantially non-metallic material has mounting openings extending at least partially therein. Other aspects and implementations of an interfacial structure for semiconductor substrate processing chambers and substrate transfer chambers are contemplated.

In one implementation, a semiconductor substrate processor includes a substrate transfer chamber and a plurality of substrate processing chambers connected therewith. An interfacial structure is received between at least one of the processing chambers and the transfer chamber. The interfacial structure includes a substantially non-metallic, thermally insulative mass of material interposed between the one processing chamber and the transfer chamber. The mass is of sufficient volume to effectively reduce heat transfer from the processing chamber to the transfer chamber than would otherwise occur in the absence of said mass of material.

In one implementation, a semiconductor substrate processing chamber and accessory attachment interfacial structure includes a body sized and shaped to engage with and between a semiconductor substrate processing chamber and an accessory attachment which is exposed to the processing chamber, with the body having first and second faces. The body includes an external perimeter extending between the first and second faces. The body includes a volume in at least one cross sectional region transverse the passageway which extends to diametrically opposing portions of the perimeter. At least a majority of said cross sectional region constitutes a mass of substantially non-metallic and thermally insulative material. The mass of material is sufficient to effectively reduce heat transfer between the semiconductor processing chamber and the accessory attachment when so engaged than would otherwise occur in the absence of said mass of material when so engaged.

Other implementations and aspects are contemplated.

BRIEF DESCRIPTION OF THE DRAWINGS

Preferred embodiments of the invention are described below with reference to the following accompanying drawings.

FIG. 4 is an enlarged sectional view taken through line 4—4 in FIG. 3.

FIG. 5 is an exploded view of the interfacial structure as appearing in FIG. 3.

FIG. 6 is an enlarged sectional view taken horizontally through the center of a connected component 40 of the above interfacial structure, as referred to below.

FIG. 7 is a further enlarged sectional view taken vertically through the center of the connected component 40 of FIG. 6.

FIG. 8 is a perspective view of a load bearing plug of the above interfacial structure.

FIG. 9 is a perspective view of another load bearing plug of the above interfacial structure.

FIG. 10 is a perspective view of a removed/unassembled portion of the above interfacial structure

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
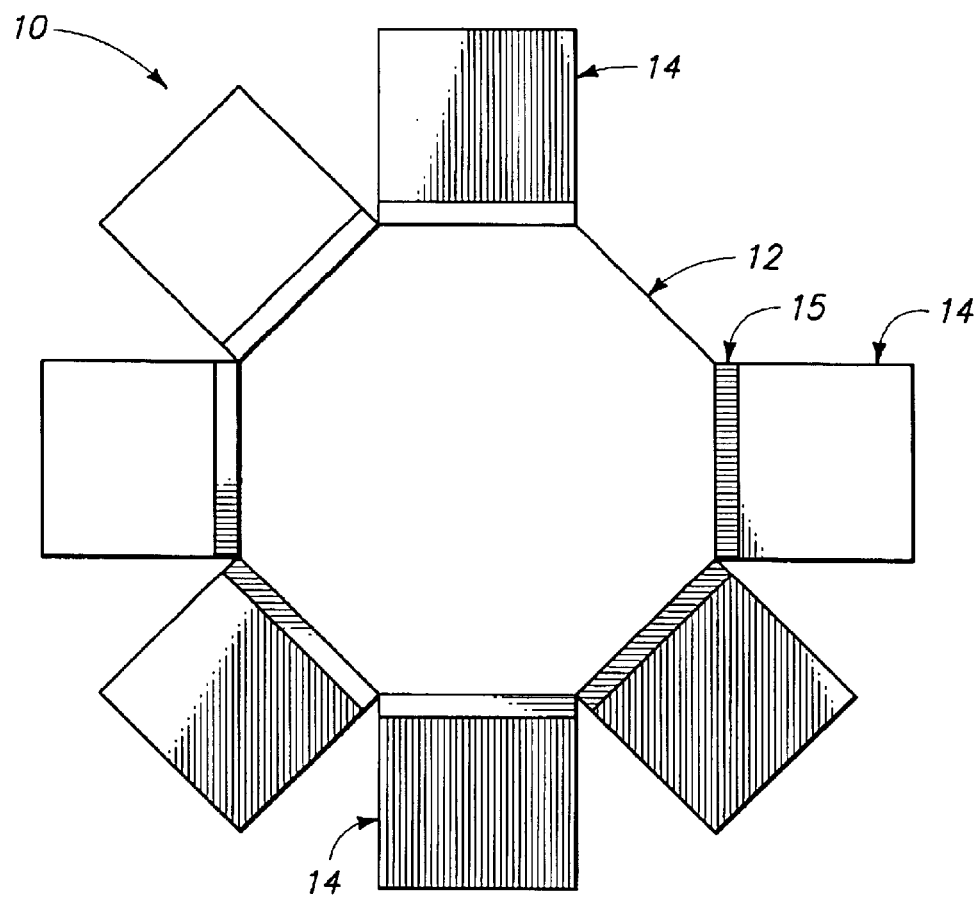
FIG. 1 is a diagrammatic top view of a semiconductor substrate processor in accordance with an aspect of the invention.
Figure 2:
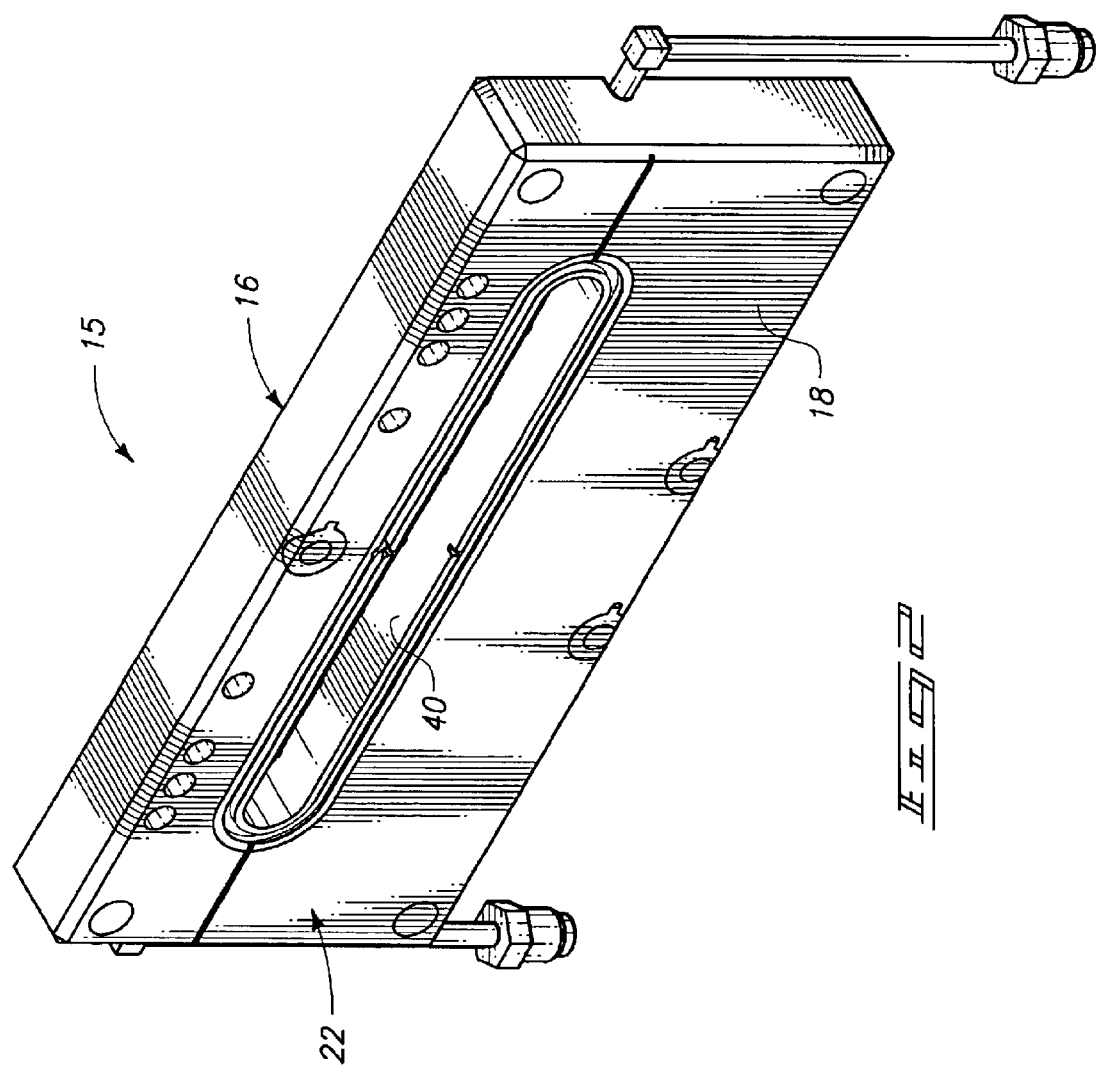
FIG. 2 is a first perspective view of an interfacial structure for receipt between a semiconductor substrate processing chamber and a substrate transfer chamber in accordance with an aspect of the invention.

Referring to FIG. 1, a semiconductor substrate processor is indicated generally with reference 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Processor 10 comprises a substrate transfer chamber 12 and a plurality of substrate processing chambers 14 connected therewith. Any existing or yet-to-be developed transfer and processing chambers are contemplated. An interfacial structure 15 is received between at least one of the processing chambers 14 and the transfer chamber 12. In one embodiment, interfacial structure 15 of a processor 10 comprises a substantially non-metallic, thermally insulative mass of material interposed between the one processing chamber and the transfer chamber, with the mass being of sufficient volume to effectively reduce heat transfer from the processing chamber to the transfer chamber than would otherwise occur in the absence of such mass of material.

But one preferred embodiment interfacial structure is shown in various attributes in FIGS. 2–10. The invention also contemplates the interfacial structure for a semiconductor substrate processing chamber and substrate transfer chamber in various subcombinations as literally worded in the accompanying claims and as interpreted in accordance with the doctrine of equivalents. Referring initially to FIGS. 2–5, interfacial structure 15 comprises a body 16 sized and shaped to engage with and between a semiconductor substrate processing chamber and a substrate transfer chamber. Body 16 comprises a mass 18 of substantially non-metallic and thermally insulative material. In the context of this document, "substantially non-metallic" defines a material having less than 50% by volume metal therein, with "metal" in such definition referring to that in elemental or alloy form. Also in the context of this document, "substantially metallic" defines a material having at least 50% by volume metal as just defined. Further in the context of this document, "thermally insulative material" defines a substance having a thermal conductivity of less than or equal to 0.02 W/cm–K. The invention was reduced-to-practice in forming mass 18 to comprise Delrin 111P sold by DuPont Engineering Polymers of Newark, Del. Such a material is understood to be polymeric. Aspects of the invention also contemplate substantially non-metallic and thermally insulative materials such as gels, ceramics, porous materials (i.e., foams), glass and others, by way of examples only. Of course, such materials might be combined or employ other materials therein, as long as such are substantially non-metallic and thermally insulative as defined herein where such language is specifically literally used in a concluding claim. Further by way of example only, such materials might include combinations of, a) solid and liquid, b) solid and gas, c) liquid and gas, and c) solid, liquid and gas. Further by way of example one, such material may or may not be homogenous.

Mass 18 includes first and second faces 20 and 22. In the depicted and preferred embodiment, face 22 is adapted for contacting engagement with a processing chamber 14, while face 20 is adapted for contacting engagement with transfer chamber 12. Of course, additional intervening structure(s)/material(s) might be provided such that one or both of faces 20 and 22 do not contact either transfer chamber 12 or processing chamber 14. Faces 20 and 22 in the preferred embodiment as shown are also preferably opposing and generally planar. Face 20 includes a recess 24 formed therein (FIG. 5). An exemplary depth or thickness of mass 18 is 1.25 inches, with an exemplary depth of recess 24 being 0.0125 inch. Mass 18 has a substrate passageway 26 extending through the thermally insulative material from first face 20 to second face 22. Slotted openings 27 are opposingly provided to passageway 20 from opposing sides/ends thereof for receiving or at least partially defining gas feed conduits as will be described below.

A plurality of openings 28, 29 and 30 are provided within mass 18 spaced from passageway 26 and extending through the thermally insulative material. Openings 29 and 30 comprise mounting openings adapted for receiving either alignment pins, bolts, or other mounting structures. Such might be used to mount relative to flanges associated with one or both of a processing chamber and a transfer chamber. In the depicted and preferred embodiment, openings 28 and 29 are configured for receiving load bearing plugs 32, 34a/34b, respectively. Load bearing plugs 32 and 34a/34b ideally have greater inherent compression strength than does the thermally insulative material of mass 18. An exemplary material is stainless steel. Typically, processing chambers 14 are tightly, compressively mounted to transfer chamber 12 using mounting bolts received through at least some of openings 30 and which may otherwise compressively deform the material of mass 18 in the absence of load bearing plugs 32 and/or 34a/34b. In the depicted preferred embodiment, mass 18 is substantially rectangular having outermost corners. The depicted four openings 28 and load bearing plugs 32 are received therein proximate such outermost corners.

Load bearing plugs 32 are depicted as being entirely solid, while load bearing plugs 34a/34b have a hollow portion in the form of an alignment pin/bolt passageway 36 received therethrough. (FIGS. 5, 8 and 9). Load bearing plugs 34a/34b advantageously include respective radial projections 38 to prevent the rotation thereof upon the receipt and mounting of alignment pin/bolts therethrough. Accordingly in the depicted and preferred embodiment, at least some of the load bearing plugs are entirely solid (i.e., plugs 32) and at least some of the load bearing plugs include a hollow portion (i.e., plugs 34a/34b).

Referring more specifically to FIGS. 4–7, body 16 comprises a substantially metallic insert 40 received within thermally insulative material substrate passageway 26. The depicted preferred embodiment insert 40 comprises two pieces 42 and 44 which are welded together. Piece 42 includes opposing gas conduits 46, with piece 44 comprising a circumferential gas conduit 48 which is fed by gas conduit 46. Exemplary material for pieces 42 and 44 is stainless steel.

Insert 40 has internal walls 50 (FIGS. 4, 6 and 7) which define an insert substrate passageway 55 (FIG. 4) through the insert and, effectively, a body substrate passageway comprising walls which define a passageway circumference. Further, at least a portion of walls 50 are substantially metallic, with all of passageway walls 50 being substantially metallic in the depicted preferred embodiment. At least two wall openings 54 are received within walls 50 and positioned to establish a gas curtain across insert passageway 55 upon effective emission of gas from said wall openings. Preferably, at least four such wall openings are provided, and more preferably at least ten wall openings. The depicted preferred embodiment shows sixteen openings 54 arranged as eight multiple pairs of directly opposing wall openings 54 which are positioned to establish a gas curtain across passageway 55 upon effective emission of gas from such openings. At least one gas feed conduit is provided in fluid communication with wall openings 54, with two such gas feed conduits 60 (FIG. 5) being depicted for engagement with conduits 46 formed in insert piece 42.

Figure 3:
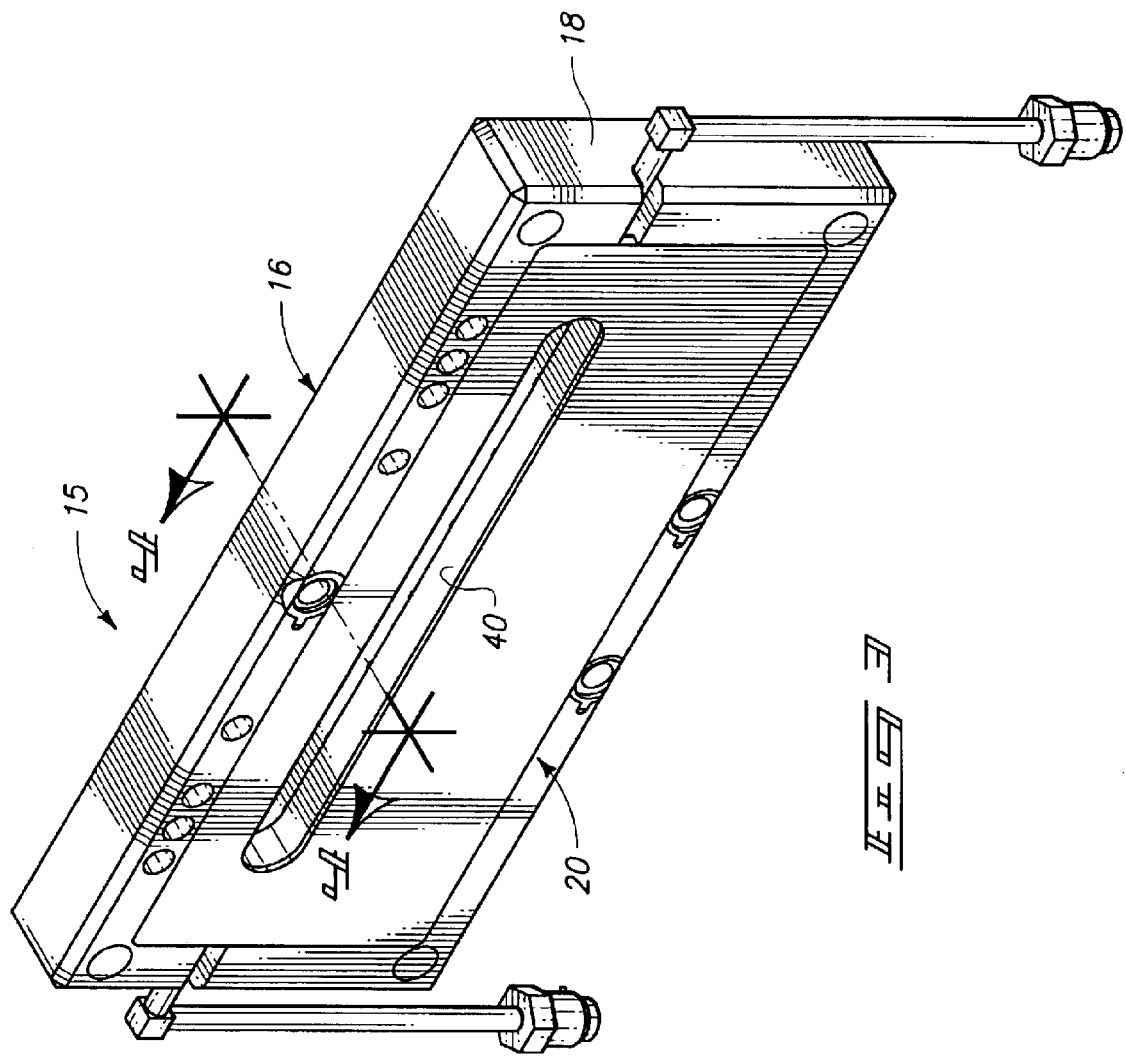
FIG. 3 is a second, reverse side, perspective view of the interfacial structure of FIG. 2.

Body 16 comprises a metal plate 64 in physical connection with substantially metallic insert 40 (FIGS. 3–5 and 10). In the depicted preferred embodiment, metal plate 64 includes a substrate passageway 66 formed therein, and a recess 68 of the same general shaped thereabout in a face of metal plate 64. (FIG. 10). Piece 42 of substantially metallic insert 40 is received within recess 68 and welded thereto. Metal plate 64 is received within face recess 24 of mass 18 of the substantially non-metallic and thermally insulative material (FIGS. 3–5).

The invention is embodied in various combinational aspects as presented in the accompanying claims. By way of example only and in but one aspect, an interfacial structure comprises a body having a substrate passageway extending therethrough having walls at least a portion of which are substantially metallic. By way of example only, walls 50 are exemplary such walls. The body comprises material peripheral of the walls (i.e., the material of mass 18) which is substantially non-metallic and thermally insulative. Such material comprises mounting openings (i.e., any of openings 30 and 29) which extend at least partially therein. In one preferred aspect, the body, for example body 16, has a greater volume of substantially non-metallic and thermally insulative material than of substantially metallic material.

In one aspect, the body, for example body 16, comprises a total volume at least a majority of which is a mass of material which is substantially non-metallic and thermally insulative. A sealant channel is received on the body peripheral of the substrate passageway. In one preferred embodiment, the sealant channel surrounds the passageway. In one preferred embodiment, the sealant channel is in the form of an O-ring groove, and in one embodiment, the sealant channel is received on the substantially metallic insert. In the depicted preferred embodiment, piece 44 of substantially metallic insert 40 depicts a sealant channel 72 peripherally surrounding passageway 55 (FIGS. 4, 6 and 7). An O-ring, gasket or other sealing material would be received within channel 72, and another O-ring/gasket/sealant received relative to a channel formed in the transfer chamber flange for providing fluid tight seals between the interface blocks and the processing chamber and transfer Chamber.

In one aspect, the body, for example body 16, comprises at least one face having a majority area which is substantially metallic. In the depicted preferred embodiment, that would be the face having exposed metal plate 64. In one aspect, the body, for example body 16, comprises at least one face having a majority area which is substantially non-metallic. In the depicted preferred embodiment, that would be the face opposing metal plate 64 as depicted, for example, in FIG. 2. In one aspect, the body comprises at least one face configured for contacting a semiconductor substrate processing chamber 14 (i.e., the face depicted in FIG. 2) and another face configured for contacting a substrate transfer chamber 12 (i.e., the face depicted in FIG. 3).

In one aspect, the body, for example body 16, can be considered as comprising an external perimeter which extends between first and second faces. The body comprises a volume in at least one cross-sectional region transverse the passageway which extends to diametrically opposing portions of the perimeter. At least a majority of said cross-sectional region constitutes a substantially non-metallic and thermally insulative material. Such an exemplary cross-sectional cut of an exemplary cross-sectional region is depicted in FIG. 4. The total depicted cross-sectional area, or any suitable sub-portion thereof, depicts a representative cross-sectional region. In one preferred embodiment, the cross-sectional region is at least one inch deep, and in another aspect preferably from one inch to two inches deep.

In one aspect of the invention, a semiconductor substrate processor is contemplated. Such includes a substrate transfer chamber and a plurality of substrate processing chambers connected therewith. An interfacial structure is received between at least one of the processing chambers and the transfer chamber. The interfacial structure comprises a body sized and shaped to engage with and between the semiconductor substrate processing chamber and the substrate transfer chamber. The body comprises a substrate passageway extending therethrough, and comprises walls which define a passageway circumference. At least two wall openings are received within the walls and are positioned to establish a gas curtain across the passageway upon the effective emission of gas from such wall openings. At least one gas feed conduit is in fluid communication with the wall openings. In one preferred embodiment, the body is substantially metallic. In another embodiment, the interfacial structure has a greater volume of substantially non-metallic and thermally insulative material than of substantially metallic material, for example such as described above with respect to body 16.

In one implementation, the invention includes an interfacial structure to be received between a semiconductor substrate processing chamber and accessory attachment. In the context of this document, an "accessory attachment" is any component other than a transfer chamber which attaches with a housing of processing chamber and communicates within the chamber. By way of example only, exemplary such devices include wafer lift assemblies, pumps, valves, etc. In one aspect, a body is sized and shaped to engage with and between a semiconductor substrate processing chamber and an accessory attachment which is exposed to the processing chamber. The body has a total volume. In one implementation, at least a majority of the total volume is a mass of material which is substantially non-metallic and thermally insulative. The mass of material is sufficient to effectively reduce heat transfer between the semiconductor processing chamber and the accessory attachment when so engaged than would otherwise occur in the absence of said mass of material when so engaged.

In one implementation, the body has first and second faces. The body includes an external perimeter extending between the first and second faces. The body comprises a volume in at least one cross sectional region transverse the passageway which extends to diametrically opposing portions of the perimeter. At least a majority of said cross sectional region constitutes a mass of substantially non-metallic and thermally insulative material. The mass of material is sufficient to effectively reduce heat transfer between the semiconductor processing chamber and the accessory attachment when so engaged than would otherwise occur in the absence of said mass of material when so engaged.

The interfacial structure to be received between a semiconductor substrate processing chamber and accessory attachment can include any of the materials or attributes described above with respect the preferred embodiment interfacial structure to be received between a semiconductor substrate processing chamber and substrate transfer chamber.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor substrate processing chamber and substrate transfer chamber interfacial structure, comprising:
   a body sized and shaped to engage with and between a semiconductor substrate processing chamber and a substrate transfer chamber effective to space the processing chamber and transfer chamber away from one another;
   the body comprising a substrate passageway extending therethrough, the passageway comprising walls at least a portion of which are substantially metallic;
   the body comprising material peripheral of the walls which is substantially non-metallic and thermally insulative, the substantially non-metallic material comprising mounting openings extending at least partially therein; and
   the body comprising a plurality of openings spaced from the passageway and which extend through the insulative material, and comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

2. The interfacial structure of claim 1 wherein all of the passageway walls are substantially metallic.

3. The interfacial structure of claim 1 wherein the body has a greater volume of substantially non-metallic and thermally insulative material than of substantially metallic material.

4. The interfacial structure of claim 1 wherein the substantially non-metallic and thermally insulative material is polymeric.

5. The interfacial structure of claim 1 wherein the substantially non-metallic and thermally insulative material is a gel.

6. The interfacial structure of claim 1 wherein the substantially non-metallic and thermally insulative material is ceramic.

7. The interfacial structure of claim 1 wherein the substantially non-metallic and thermally insulative material is a porous.

8. The interfacial structure of claim 1 wherein the substantially non-metallic and thermally insulative material is a glass.

9. The interfacial structure of claim 1 wherein the substantially non-metallic and thermally insulative material is a combination of at least two of solid, liquid and gas.

10. The interfacial structure of claim 1 wherein the passageway walls comprises at least two wall openings positioned to establish a gas curtain across the passageway upon effective emission of gas from said wall openings, and further comprising a least one gas feed conduit in fluid communication with the wall openings.

11. A semiconductor substrate processing chamber and substrate transfer chamber interfacial structure, comprising:
    a body sized and shaped to engage with and between a semiconductor substrate processing chamber and a substrate transfer chamber effective to space the processing chamber and transfer chamber away from one another, the body comprising a total volume, a majority of the total volume being a mass of material which is substantially non-metallic and thermally insulative;
    the body comprising a substrate passageway extending therethrough;
    a sealant channel received on the body peripheral of the passageway; and
    the body comprising a substantially metallic insert received within the passageway, the insert defining an insert substrate passageway therethrough, the sealant channel being received on the substantially metallic insert.

12. The interfacial structure of claim 11 wherein the sealant channel surrounds the insert substrate passageway.

13. The interfacial structure of claim 11 wherein the sealant channel comprises an O-ring groove peripherally surrounding the insert substrate passageway.

14. The interfacial structure of claim 11 wherein the substantially non-metallic and thermally insulative material is polymeric.

15. The interfacial structure of claim 11 wherein the body is substantially rectangular.

16. The interfacial structure of claim 11 wherein the body comprises at least one face having a majority area which is substantially metallic.

17. The interfacial structure of claim 11 wherein the body comprises at least one face having a majority area which is substantially non-metallic.

18. The interfacial structure of claim 11 wherein the body comprises at least one face configured for contacting a semiconductor substrate processing chamber, and another face configured for contacting a substrate transfer chamber.

19. The interfacial structure of claim 18 wherein the one and another faces are generally planar.

20. The interfacial structure of claim 18 wherein the sealant channel is formed on the one face.

21. The interfacial structure of claim 18 wherein the another face has a majority area which is substantially metallic.

22. A semiconductor substrate processing chamber and substrate transfer chamber interfacial structure, comprising:

a body sized and shaped to engage with and between a semiconductor substrate processing chamber and a substrate transfer chamber effective to space the processing chamber and transfer chamber away from one another, the body having first and second faces;

the body comprising a substrate passageway extending therethrough from the first face to the second face;

the body comprising an external perimeter extending between the first and second faces;

the body comprising a volume in at least one cross sectional region transverse the passageway which extends to diametrically opposing portions of the perimeter, at least a majority of said cross sectional region constituting a substantially non-metallic and thermally insulative material;

the body comprising substantially metallic material, the body having a greater volume of substantially non-metallic and thermally insulative material than of substantially metallic material; and the body comprising a plurality of openings spaced from the passageway and which extend through the insulative material, and comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

23. The interfacial structure of claim 22 wherein the passageway comprises walls, at least a portion of the walls being substantially metallic.

24. The interfacial structure of claim 22 wherein the cross sectional region is at least one inch deep.

25. The interfacial structure of claim 22 wherein the cross sectional region is from one inch to two inches deep.

26. The interfacial structure of claim 22 wherein the body comprises at least one face configured for contacting a semiconductor substrate processing chamber, and another face configured for contacting a substrate transfer chamber.

27. A semiconductor substrate processing chamber and substrate transfer chamber interfacial structure, comprising:

a body sized and shaped to engage with and between a semiconductor substrate processing chamber and a substrate transfer chamber effective to space the processing chamber and transfer chamber away from one another, the body comprising a mass of substantially non-metallic and thermally insulative material;

the mass comprising a substrate passageway extending through the thermally insulative material;

the body comprising a substantially metallic insert received within the thermally insulative material substrate passageway, the insert defining an insert substrate passageway therethrough; and the body comprising a plurality of openings spaced from the passageway and which extend through the insulative material, and comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

28. The interfacial structure of claim 27 wherein the body has a greater volume of substantially non-metallic and thermally insulative material than of substantially metallic, material.

29. The interfacial structure of claim 27 wherein the substantially non-metallic and thermally insulative material is polymeric.

30. The interfacial structure of claim 27 comprising bolt holes extending through the mass and spaced from the passageway.

31. A semiconductor substrate processing chamber and substrate transfer chamber interfacial structure, comprising:

a body sized and shaped to engage with and between a semiconductor substrate processing chamber and a substrate transfer chamber effective to space the processing chamber and transfer chamber away from one another, the body comprising a mass of substantially non-metallic and thermally insulative material;

the body comprising a substrate passageway extending through the thermally insulative material;

the body comprising a plurality of openings spaced from the passageway and which extend through the thermally insulative material; and the body comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

32. The interfacial structure of claim 31 wherein the body is substantially rectangular having outermost corners, at least four of said openings and load bearing plugs being respectively received proximate the outermost corners.

33. The interfacial structure of claim 32 wherein said four load bearing plugs are entirely solid.

34. The interfacial structure of claim 31 wherein the body comprises a substantially metallic insert received within the passageway, the insert defining an insert substrate passageway therethrough.

35. A semiconductor substrate processing chamber and substrate transfer chamber interfacial structure, comprising:

a body sized and shaped to engage with and between a semiconductor substrate processing chamber and a substrate transfer chamber effective to space the processing chamber and transfer chamber away from one another; the body comprising both substantially non-metallic, thermally insulative material and substantially metallic material; the body having a greater volume of substantially non-metallic and thermally insulative material than of substantially metallic material;

the body comprising a substrate passageway extending therethrough, the passageway comprising walls which define a passageway circumference;

at least two wall openings within the walls positioned to establish a gas curtain across the passageway upon effective emission of gas from said wall openings;

at least one gas feed conduit in fluid communication with the wall openings; and the body comprising a plurality of openings spaced from the passageway and which extend through the insulative material, and comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

36. The interfacial structure of claim 35 comprising at least two gas feed conduits in fluid communication with the wall openings.

37. The interfacial structure of claim 35 comprising only two gas feed conduits in fluid communication with the wall openings.

38. The interfacial structure of claim 35 comprising at least 4 wall openings within the walls positioned to establish a gas curtain across the passageway upon effective emission of gas from said wall openings.

39. The interfacial structure of claim at 35 comprising at least 10 wall openings within the walls positioned to establish a gas curtain across the passageway upon effective emission of gas from said wall openings.

40. The interfacial structure of claim 35 comprising multiple pairs of directly opposing wall openings within the walls positioned to establish a gas curtain across the passageway upon effective emission of gas from said wall openings.

41. A semiconductor substrate processing chamber and substrate transfer chamber interfacial structure, comprising:

a body sized and shaped to engage with and between a semiconductor substrate processing chamber and a substrate transfer chamber effective to space the processing chamber and transfer chamber away from one another, the body comprising a mass of substantially non-metallic and thermally insulative material, the mass having first and second faces, the body having a greater volume of substantially non-metallic and thermally insulative material than of substantially metallic material;

the body comprising a substrate passageway extending through the thermally insulative material from the first face to the second face;

the body comprising a substantially metallic insert received within the thermally insulative material substrate passageway, the insert having internal walls defining an insert substrate passageway through the insert, the walls defining an insert substrate passageway circumference, at least two wall openings received within the walls positioned to establish a gas curtain across the insert passageway upon effective emission of gas from said wall openings;

at least one gas feed conduit in fluid communication with the wall openings; and the body comprising a plurality of openings spaced from the passageway and which extend through the insulative material, and comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

42. The interfacial structure of claim 41 wherein the substantially non-metallic and thermally insulative material is polymeric.

43. The interfacial structure of claim 41 further comprising a sealant channel received on the body.

44. The interfacial structure of claim 43 further comprising a sealant channel received on the substantially metallic insert.

45. A semiconductor substrate processing chamber and substrate transfer chamber interfacial structure, comprising:

a body sized and shaped to engage with and between a semiconductor substrate processing chamber and a substrate transfer chamber, the body comprising a mass of substantially non-metallic and thermally insulative material, the mass having first and second opposing and generally planar faces, one of the faces having a recess formed therein;

the body comprising a substrate passageway extending through the thermally insulative material from the first face to the second face;

the body comprising a plurality of openings spaced from the passageway and which extend through the thermally insulative material;

the body comprising a substantially metallic insert received within the thermally insulative material substrate passageway, the insert having internal walls defining an insert substrate passageway through the insert, the walls defining an insert substrate passageway circumference, at least two wall openings received within the walls positioned to establish a gas curtain across the insert passageway upon effective emission of gas from said wall openings;

at least one gas feed conduit in fluid communication with the wall openings;

the body comprising load bearing plugs received within at least some of the openings in the thermally insulative material, the load bearing plugs having greater compression strength than the thermally insulative material; and the body comprising a metal plate in physical connection with the substantially metallic insert, the metal plate being received with the face recess of the mass of substantially non-metallic and thermally insulative material.

46. The interfacial structure of claim 45 wherein the body has a greater volume of substantially non-metallic and thermally insulative material than of substantially metallic material.

47. The interfacial structure of claim 45 further comprising a sealant channel received on the body.

48. The interfacial structure of claim 47 further comprising a sealant channel received on the substantially metallic insert.

49. The interfacial structure of claim 45 wherein the body is substantially rectangular.

50. The interfacial structure of claim 45 wherein at least some of the load bearing plugs are entirely solid.

51. The interfacial structure of claim 45 wherein at least some of the load bearing plugs include a hollow portion.

52. The interfacial structure of claim 45 wherein at least some of the load bearing plugs are entirely solid and at least some include a hollow portion.

53. The interface structure of claim 45 wherein the body is substantially rectangular having outermost corners, at least four of the openings within the insulative material and load bearing plugs being respectively received proximate the outermost corners.

54. The interfacial structure of claim 53 wherein said four load bearing plugs are entirely solid.

55. The interfacial structure of claim 53 comprising at least two gas feed conduits in fluid communication with the wall openings.

56. The interfacial structure of claim 53 comprising only two gas feed conduits in fluid communication with the wall openings.

57. The interfacial structure of claim 53 comprising at least 4 wall openings within the walls positioned to establish a gas curtain across the passageway upon effective emission of gas from said wall openings.

58. The interfacial structure of claim 53 comprising at least 10 wall openings within the walls positioned to establish a gas curtain across the passageway upon effective emission of gas from said wall openings.

59. The interfacial structure of claim 53 comprising multiple pairs of directly opposing wall openings within the walls positioned to establish a gas curtain across the passageway upon effective emission of gas from said wall openings.

60. A semiconductor substrate processor comprising:
   a semiconductor substrate transfer chamber and a plurality of semiconductor substrate processing chambers connected therewith;
   an interfacial structure received between at least one of the semiconductor substrate processing chambers and the transfer chamber, the interfacial structure comprising a substantially non-metallic, thermally insulative mass of material interposed between the one processing chamber and the transfer chamber effective to space the processing chamber and transfer chamber away from one another, the mass being of sufficient volume to effectively reduce heat transfer from the semiconductor substrate processing chamber to the semiconductor substrate transfer chamber than would otherwise occur in the absence of said mass of material;
   the interfacial structure comprising a body comprising a substrate passageway extending therethrough, the passageway comprising walls at least a portion of which are substantially metallic; and the body comprising material peripheral of the walls which is substantially non-metallic and thermally insulative; and
   the body comprising a plurality of openings spaced from the passageway and which extend through the insulative material, and comprising load bearing plugs received within at least some of the openings in the thermally insulative material, the load bearing plugs having greater compression strength than the thermally insulative material, at least some of the load bearing plugs comprising holes extending therethrough which are sized to receive mounting bolts, at least some of the load bearing plugs being entirely solid.

61. The processor of claim 60 comprising a sealant channel received on the body peripheral of the passageway.

62. The processor of claim 60 wherein the body has first and second faces;
   the substrate passageway extending from the first face to the second face;
   the body comprising an external perimeter extending between the first and second faces; and
   the body comprising a volume in at least one cross sectional region transverse the passageway which extends to diametrically opposing portions of the perimeter, at least a majority of said cross sectional region constituting a substantially non-metallic and thermally insulative material.

63. The processor of claim 60 wherein the body comprises a substantially metallic insert received within the thermally insulative material substrate passageway, the insert defining an insert substrate passageway therethrough.

64. The processor of claim 60 wherein the body has a greater volume of substantially non-metallic and thermally insulative material than of substantially metallic material;
   the passageway comprising walls which define a passageway circumference;
   at least two wall openings within the walls positioned to establish a gas curtain across the passageway upon effective emission of gas from said wall openings; and
   at least one gas feed conduit in fluid communication with the wall openings.

65. The processor of claim 60 wherein the body comprises a mass of substantially non-metallic and thermally insulative material, the mass having first and second faces, the body having a greater volume of substantially non-metallic and thermally insulative material than of substantially metallic material;
   the body comprising a substrate passageway extending through the thermally insulative material from the first face to the second face;
   the body comprising a substantially metallic insert received within the thermally insulative material substrate passageway, the insert having internal walls defining an insert substrate passageway through the insert, the walls defining an insert substrate passageway circumference, at least two wall openings received within the walls positioned to establish a gas curtain across the insert passageway upon effective emission of gas from said wall openings; and
   at least one gas feed conduit in fluid communication with the wall openings.

66. A semiconductor substrate processor comprising:
   a semiconductor substrate transfer chamber and a plurality of semiconductor substrate processing chambers connected therewith;
   an interfacial structure received between at least one of the semiconductor substrate processing chambers and the transfer chamber, the interfacial structure comprising a substantially non-metallic, thermally insulative mass of material interposed between the one processing chamber and the transfer chamber, the mass being of sufficient volume to effectively reduce heat transfer from the semiconductor substrate processing chamber to the semiconductor substrate transfer chamber than would otherwise occur in the absence of said mass of material;
   the interfacial structure comprising a body comprising a mass of substantially non-metallic and thermally insulative material, the mass having first and second opposing and generally planar faces, one of the faces having a recess formed therein;
   the body comprising a substrate passageway extending through the thermally insulative material from the first face to the second face;

the body comprising a plurality of openings spaced from the passageway and which extend through the thermally insulative material;

the body comprising a substantially metallic insert received within the thermally insulative material substrate passageway, the insert having internal walls defining an insert substrate passageway through the insert, the walls defining an insert substrate passageway circumference, at least two wall openings received within the walls positioned to establish a gas curtain across the insert passageway upon effective emission of gas from said wall openings;

at least one gas feed conduit in fluid communication with the wall openings;

the body comprising load bearing plugs received within at least some of the openings in the thermally insulative material, the load bearing plugs having greater compression strength than the thermally insulative material; and the body comprising a metal plate in physical connection with the substantially metallic insert, the metal plate being received with the face recess of the mass of substantially non-metallic and thermally insulative material.

67. The interfacial structure of claim of claim 45 wherein the body is sized and shaped effective to space the processing chamber and transfer chamber away from one another.

68. The interfacial structure of claim of claim 66 wherein the mass effectively spaces the processing chamber and transfer chamber away from one another.

* * * * *

UNITED STATES PATENT AND TRADEMARK OFFICE
CERTIFICATE OF CORRECTION

PATENT NO. : 6,800,172 B2
DATED : October 5, 2004
INVENTOR(S) : Carpenter et al.

It is certified that error appears in the above-identified patent and that said Letters Patent is hereby corrected as shown below:

Column 4,
Line 25, please delete "c)" after "and" and insert -- d) --.

Column 16,
Line 13, please delete "of claim" after "of claim".

Signed and Sealed this

Nineteenth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,800,172 B2
DATED : October 5, 2004
INVENTOR(S) : Craig M. Carpenter et al.

It is certified that error appears in the above-identified patent and that said Letters Patent is hereby corrected as shown below:

<u>Column 4,</u>
Line 26, replace "one" with -- only --.

Signed and Sealed this

Eighth Day of November, 2005

JON W. DUDAS
*Director of the United States Patent and Trademark Office*